United States Patent
Morisaki et al.

(10) Patent No.: US 9,972,491 B2
(45) Date of Patent: May 15, 2018

(54) MASK DATA GENERATION METHOD, MASK DATA GENERATION SYSTEM, AND RECORDING MEDIUM

(71) Applicant: TOSHIBA MEMORY CORPORATION, Minato-ku (JP)

(72) Inventors: Tsuyoshi Morisaki, Yokkaichi (JP); Satoshi Usui, Nagoya (JP); Katsuhiro Ishiba, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 743 days.

(21) Appl. No.: 14/476,945

(22) Filed: Sep. 4, 2014

(65) Prior Publication Data

US 2015/0379185 A1    Dec. 31, 2015

Related U.S. Application Data

(60) Provisional application No. 62/018,177, filed on Jun. 27, 2014.

(51) Int. Cl.
*G06F 17/50* (2006.01)
*H01L 21/027* (2006.01)
*G03F 1/36* (2012.01)

(52) U.S. Cl.
CPC ............ *H01L 21/0271* (2013.01); *G03F 1/36* (2013.01)

(58) Field of Classification Search
CPC .............................. H01L 21/0271; G03F 1/36
See application file for complete search history.

(56) References Cited

U.S. PATENT DOCUMENTS

2008/0070414 A1    3/2008    Shiraishi

FOREIGN PATENT DOCUMENTS

| JP | 2006-276491 | 10/2006 |
| JP | 3959212 | 8/2007 |
| JP | 2008-76505 | 4/2008 |

*Primary Examiner* — Vuthe Siek
*Assistant Examiner* — Aric Lin
(74) *Attorney, Agent, or Firm* — Oblon, McClelland, Maier & Neustadt, L.L.P.

(57) ABSTRACT

According to one embodiment, there is provided a mask data generation method. The mask data generation method includes obtaining depth information about a pattern depth of a hole included in design information about a semiconductor device. The mask data generation method includes obtaining a first correction rule used to correct, in terms of the pattern depth, a process conversion difference between a resist pattern and a processed pattern. The mask data generation method includes determining temporary mask data including a lithography target pattern by applying a first process conversion difference correction processing to a dimension of hole pattern arranged in design layout data based on the depth information and the first correction rule.

3 Claims, 15 Drawing Sheets

Fig. 7A
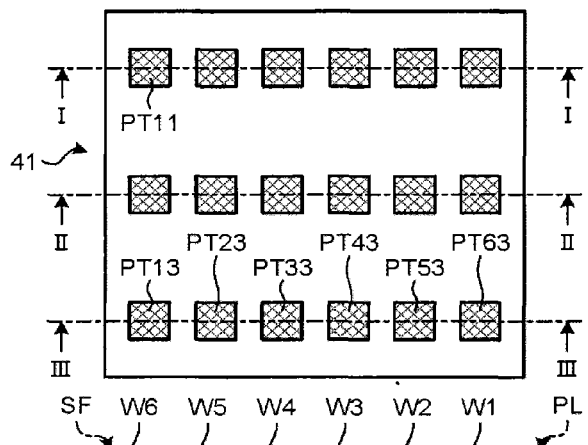
Fig. 7B
Fig. 7C
| LAYER NUMBER | PATTERN DEPTH |
|---|---|
| A | a≦W |
| B | b≦W<a |
| C | c≦W<b |
| D | d≦W<c |
46
Fig. 7D
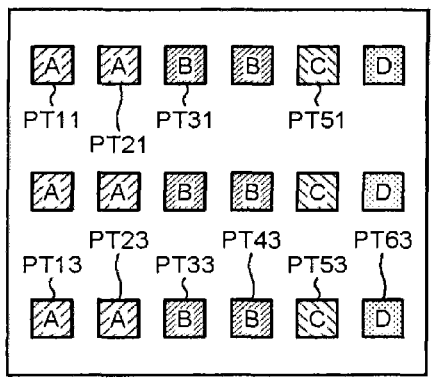
Fig. 7E
| PATTERN IDENTIFIER | LAYER NUMBER |
|---|---|
| PATTERN PT 11 | A |
| ⋮ | ⋮ |
| PATTERN PT 13 | A |
| ⋮ | ⋮ |
| PATTERN PT 23 | A |
| ⋮ | ⋮ |
| PATTERN PT 33 | B |
| ⋮ | ⋮ |
| PATTERN PT 43 | B |
| ⋮ | ⋮ |
| PATTERN PT 53 | C |
| ⋮ | ⋮ |
| PATTERN PT 63 | D |
Fig. 7F
| PATTERN IDENTIFIER | PATTERN DEPTH |
|---|---|
| PATTERN PT 11 | Wpt11 |
| ⋮ | ⋮ |
| PATTERN PT 13 | Wpt13(=W6) |
| ⋮ | ⋮ |
| PATTERN PT 63 | Wpt63(=W1) |
43

Fig. 8A
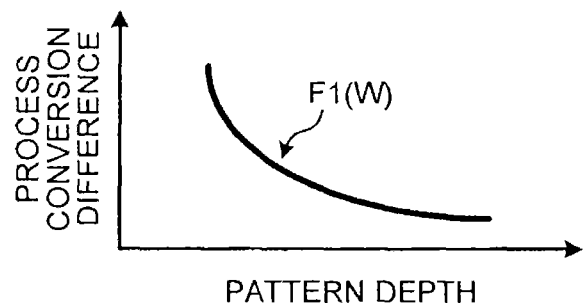
Fig. 8B
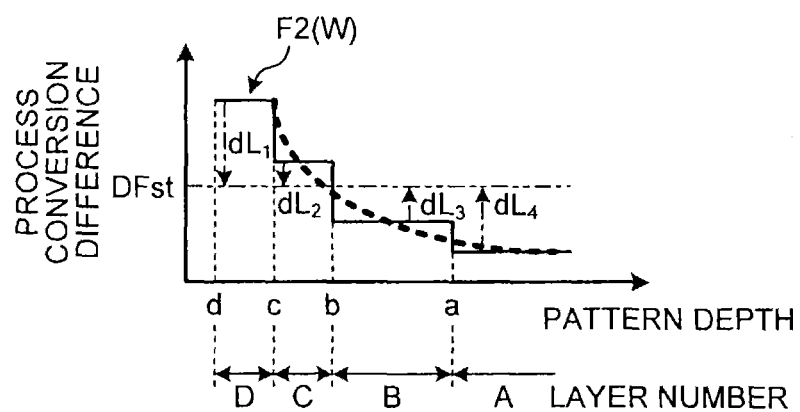
Fig. 8C
| LAYER NUMBER | AMOUNT OF CORRECTION |
|---|---|
| A | $dL_4$ |
| B | $dL_3$ |
| C | $dL_2$ |
| D | $dL_1$ |
←—45

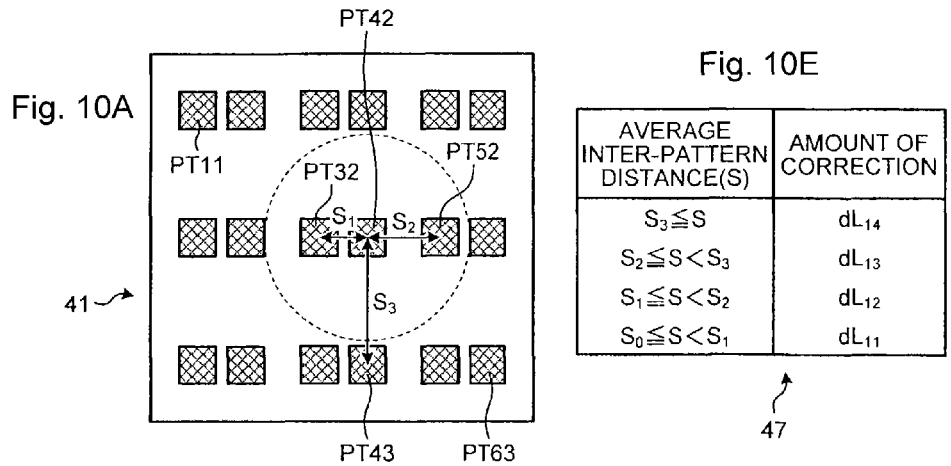
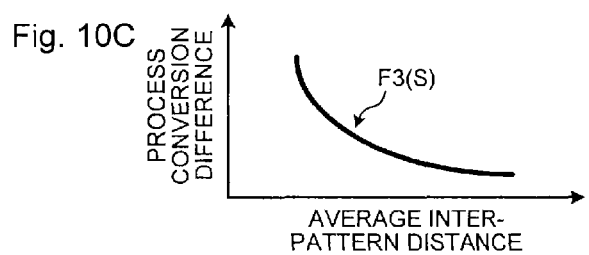
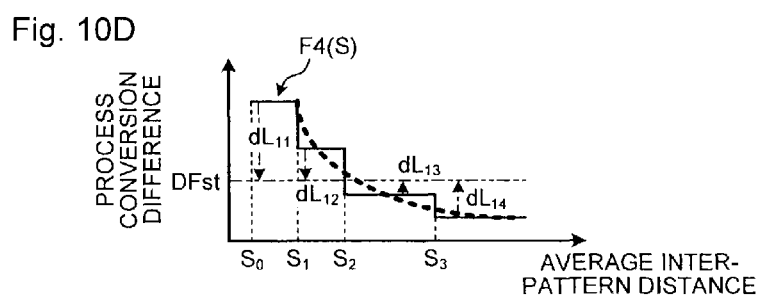

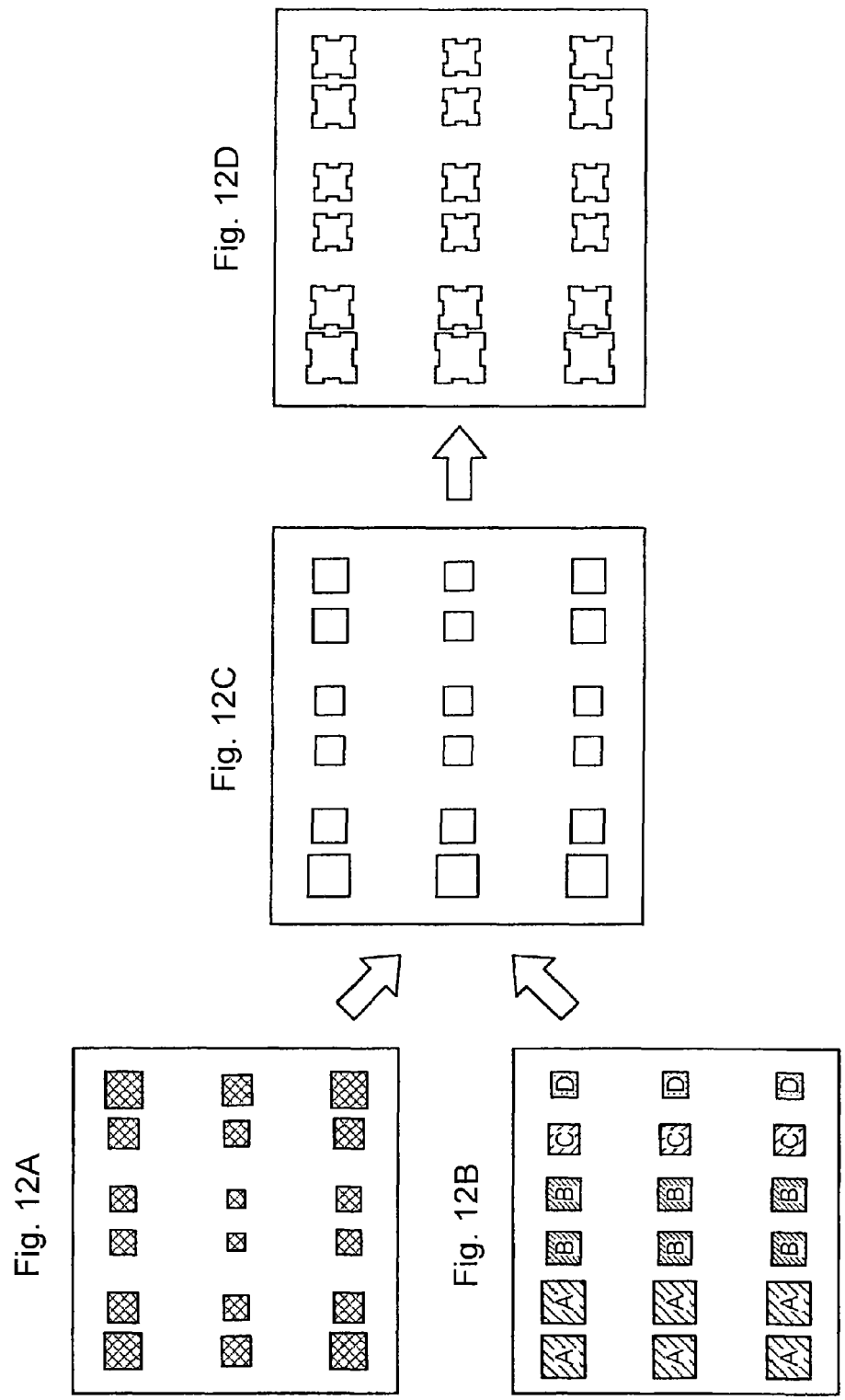

Fig. 14A
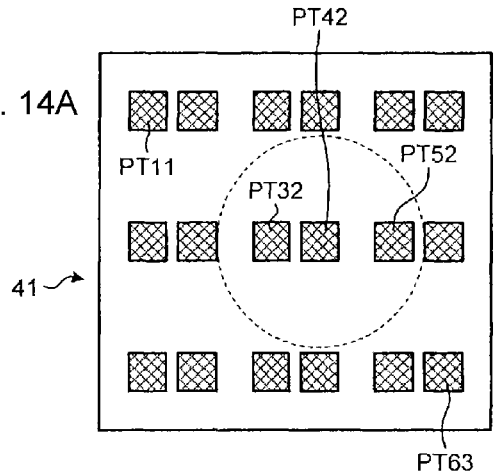
Fig. 14B
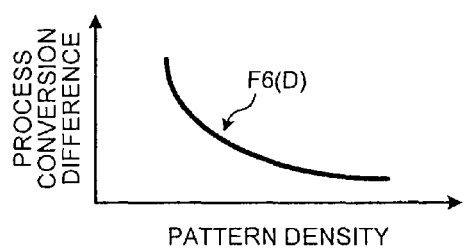
Fig. 14C
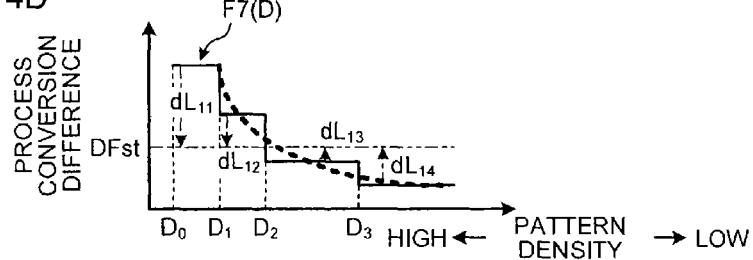
Fig. 14D
Fig. 14E
| PATTERN DENSITY(D) | AMOUNT OF CORRECTION |
|---|---|
| $D_3 \geqq D$ | $dL_{14}$ |
| $D_2 \geqq D > D_3$ | $dL_{13}$ |
| $D_1 \geqq D > D_2$ | $dL_{12}$ |
| $D_0 \geqq D > D_1$ | $dL_{11}$ |

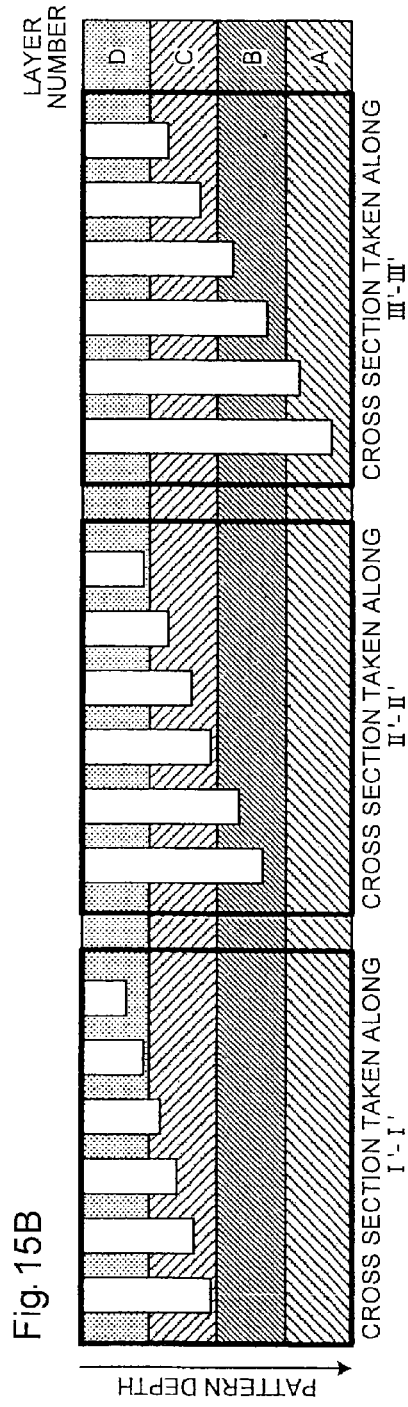
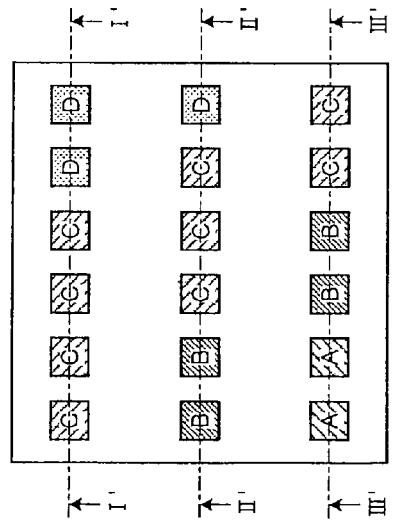
Fig. 15A
Fig. 15B
Fig. 15C

MASK DATA GENERATION METHOD, MASK DATA GENERATION SYSTEM, AND RECORDING MEDIUM

CROSS-REFERENCE TO RELATED APPLICATIONS

This application is based upon and claims the benefit of priority from U.S. Provisional Application No. 62/018,177, filed on Jun. 27, 2014, the entire contents of which are incorporated herein by reference.

FIELD

Embodiments described herein relate generally to a mask data generation method, a mask data generation system, and a recording medium.

BACKGROUND

With the reduction in the sizes of semiconductor devices in recent years, the sizes of resist patterns used in lithography steps are also reduced. For this reason, even when a mask pattern is generated to be similar to a design layout pattern, and a resist pattern is formed by using the mask pattern, there may be a process conversion difference in the dimension of the processed pattern with respect to the dimension of the resist pattern. Therefore, in order to make the processed pattern more similar to the design layout pattern, it is desired to highly accurately correct the process conversion difference when the mask data are generated.

BRIEF DESCRIPTION OF THE DRAWINGS

FIGS. 7A-7F are figures illustrating depth information, layer number table, and pattern management information according to the embodiment;

FIGS. 8A-8C are figures illustrating the first correction rule according to the embodiment;

FIGS. 10A-10E are figures illustrating the arrangement information and the second correction rule according to the embodiment;

FIGS. 12A-12D are figures illustrating determination processing of temporary mask data and generation processing of mask data according to the embodiment;

FIGS. 14A-14E are figures illustrating arrangement information and a second correction rule according to the modification of the embodiment; and FIGS. 15A-15C are figures illustrating a layer number table and pattern management information according to another modification of the embodiment.

DETAILED DESCRIPTION

In general, according to one embodiment, there is provided a mask data generation method. The mask data generation method includes obtaining depth information about a pattern depth of a hole included in design information about a semiconductor device. The mask data generation method includes obtaining a first correction rule used to correct, in terms of the pattern depth, a process conversion difference between a resist pattern and a processed pattern. The mask data generation method includes determining temporary mask data including a lithography target pattern by applying a first process conversion difference correction processing to a dimension of hole pattern arranged in design layout data based on the depth information and the first correction rule.

Exemplary embodiments of a mask data generation method will be explained below in detail with reference to the accompanying drawings. The present invention is not limited to the following embodiments.

Embodiment

The mask data generation method, mask data generation system, and recording medium are used in, for example, a lithography step of a manufacturing step of a semiconductor device. For example, when mask data of a hole pattern which is to be formed in a predetermined processed layer are generated, a mask data generation program read from a recording medium is executed by a computer (see FIG. 1), and data of the mask are generated based on design layout data. Then, the mask is generated using the data of the mask generated.

Figure 2:
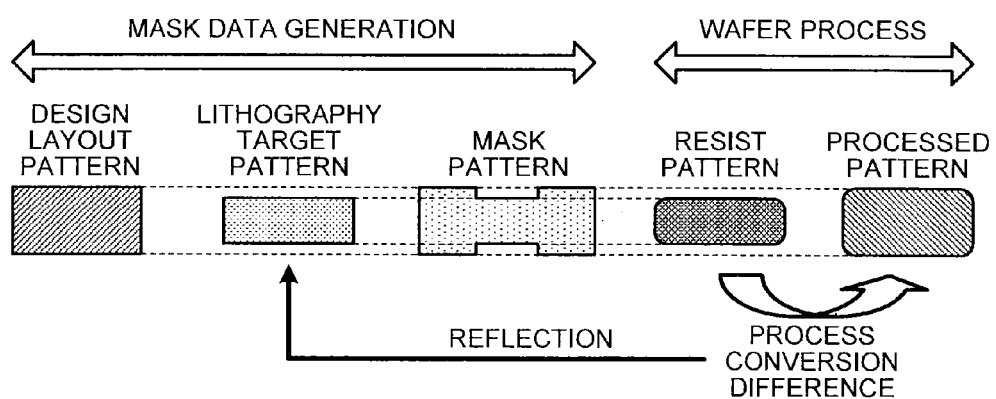
FIG. 2 is a figure illustrating generation of a process conversion difference according to the embodiment.

At this occasion, even when the mask pattern is generated so as to be similar to the design layout pattern, and the resist pattern is generated using an exposure device (see FIG. 13) using the mask pattern, there may occur a process conversion difference in the dimension of the processed pattern with respect to the dimension of the resist pattern as illustrated in FIG. 2. FIG. 2 is a figure illustrating occurrence of process conversion difference. According to this, it is desired to correct, with a high degree of accuracy, the process conversion difference, so that the processed pattern becomes similar to the design layout pattern when the mask data are generated.

The development of a three-dimensional NAND flash memory has become the mainstream in the development of a semiconductor device (semiconductor memory). The three-dimensional NAND flash memory is formed with memory cells not only in the horizontal direction but also in the direction substantially perpendicular to the surface of the semiconductor substrate for the purpose of reducing the cost per bit. The flat NAND flash memory can increase its storage capacity by mainly reducing the pattern pitch in the horizontal direction, whereas the three-dimensional NAND flash memory can increase its storage capacity not only by reducing the pattern pitch in the horizontal direction but also by increasing the number of stacked layers. Since the three-dimensional NAND flash memory can increase its storage capacity also by increasing the number of stacked layers, the necessity of using a higher level of patterning technique can be reduced, and the cost per bit can be easily reduced.

In the three-dimensional NAND flash memory, multiple lines may be drawn in a stepwise manner from the memory array area to the peripheral area in order to improve the access performance of multiple memory cells accessing the three-dimensionally arranged memory array area. In the three-dimensional NAND flash memory, multiple via plugs extending in the depth direction to different depths from a predetermined wire layer in the peripheral area may be configured to connect to multiple lines drawn in a stepwise manner. For example, since it is necessary to apply a voltage to a control electrode of each memory cell formed in the vertical direction, word lines (WLs) in stages connected to the control electrodes are provided in a stepwise structure, and multiple via plugs of which depths are different are connected to the word lines (WLs) in the stages. For example, multiple holes where multiple via plugs are buried are formed by a batch process with different process film thicknesses in a single step (see FIG. 7B).

In this way, in the mask data of a mask for forming a resist pattern used for batch process for making multiple holes extending in the depth direction to different depths from each other from a predetermined flat surface, the precision of process conversion difference correction may not satisfy the required precision by just correcting the process conversion difference with regard to arrangement attributes in the horizontal direction. More specifically, even when a resist pattern is formed using a mask pattern and multiple holes are processed using the resist pattern, the dimensions of the multiple processed holes may be likely to be out of the tolerance ranges beyond the hole pattern of the design layout data, and the multiple holes may not be processed with the required precision.

As above, in the three-dimensional NAND flash memory, the storage capacity can be increased by increasing the number of stacked layers, and therefore, the development to increase the number of stacked layers will be done from now on in a concentrated manner, and it is expected that the variation on the pattern depths of the holes will increase. In order to increase the arrangement density in the memory array area, the process of the holes is required to attain a stricter precision. For this reason, it is considered to be necessary to correct the process conversion difference with attention to the difference in the pattern depths of the holes to be processed.

Therefore, in the present embodiment, information about a pattern depth of a hole are obtained, and a correction rule (first correction rule) for a process conversion difference corresponding to a pattern depth of a hole to be processed is generated. Then, based on the information about the pattern depth and the first correction rule, process conversion difference correction is carried out on the dimension of each hole pattern on the design layout data, so that the precision in the process conversion difference correction processing is improved.

Figure 1:
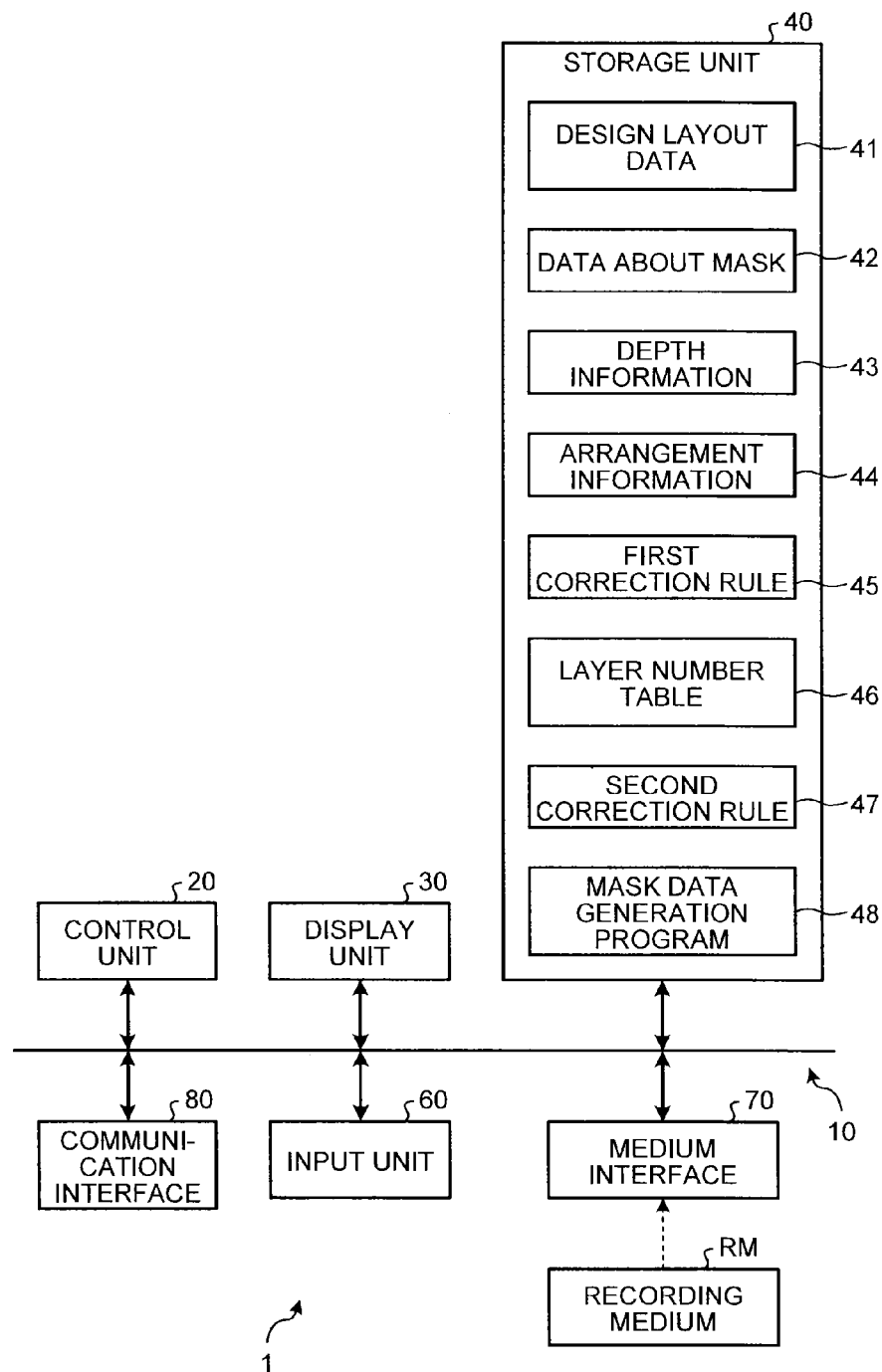
FIG. 1 is a figure illustrating a configuration of a computer executing a mask data generation program according to an embodiment.

For example, a mask data generation program is executed by a computer 1 as illustrated in FIG. 1. FIG. 1 is a figure illustrating a configuration of a computer 1 executing the mask data generation program.

The computer 1 includes a bus wire 10, a control unit 20, a display unit 30, a storage unit 40, an input unit 60, a medium interface 70, and a communication interface 80.

The control unit 20, the display unit 30, the storage unit 40, the input unit 60, the medium interface 70, and the communication interface 80 are connected with each other via a bus wire 10. The medium interface 70 is configured to be connectable to a recording medium RM. The communication interface 80 can receive information from the outside via a wired communication like or a wireless communication like.

The storage unit 40 stores design layout data 41, data 42 about a mask, depth information 43, arrangement information 44, a first correction rule 45, a layer number table 46, a second correction rule 47, and a mask data generation program 48. The design layout data 41 are data of a pattern which is layout-designed in the design of an integrated circuit and the like (hereinafter referred to as a design layout pattern). The data 42 about the mask are data for drawing a pattern on a mask MK (see FIG. 13). The depth information 43 is information about the pattern depths of the holes included in the design information (see FIG. 3) of the semiconductor device (semiconductor memory). The arrangement information 44 is information about arrangement attributes (for example, average inter-pattern distance), in the horizontal direction, of the holes included in the design information about the semiconductor device. The first correction rule 45 is a correction rule used to correct, with regard to the pattern depth, the process conversion difference between the resist pattern and the processed pattern. The layer number table 46 is a table including multiple layer numbers which are classified with regard to the pattern depth, and is a table for managing the multiple layer numbers. The second correction rule 47 is a correction rule used to correct, with regard to the arrangement attributes in the horizontal direction, the process conversion difference between the resist pattern and the processed pattern. The mask data generation program 48 is a program for generating the data 42 about the mask. On the mask MK, illumination light is emitted via an illumination optical system 214 of an exposure device 201 (see FIG. 13), and the illumination light is used to form a latent image on a photosensitive material on a substrate via a projection optical system 215.

The control unit 20 includes, for example, a CPU, a GPU, a DSP, a micro computer, or the like, and further includes a cache memory for temporal storage. The display unit 30 is a display device such as a CRT display and a liquid crystal display. The storage unit 40 is, for example, a memory and a hard disk. The input unit 60 is, for example, a keyboard and a mouse. The medium interface 70 is, for example, a flexible disk drive, a CD-ROM drive, and a USB interface. The recording medium RM is a flexible disk, a CD-ROM, a USB memory, and the like. The communication interface 80 is an interface configured according to a standard of wired communication or wireless communication.

Figure 3:
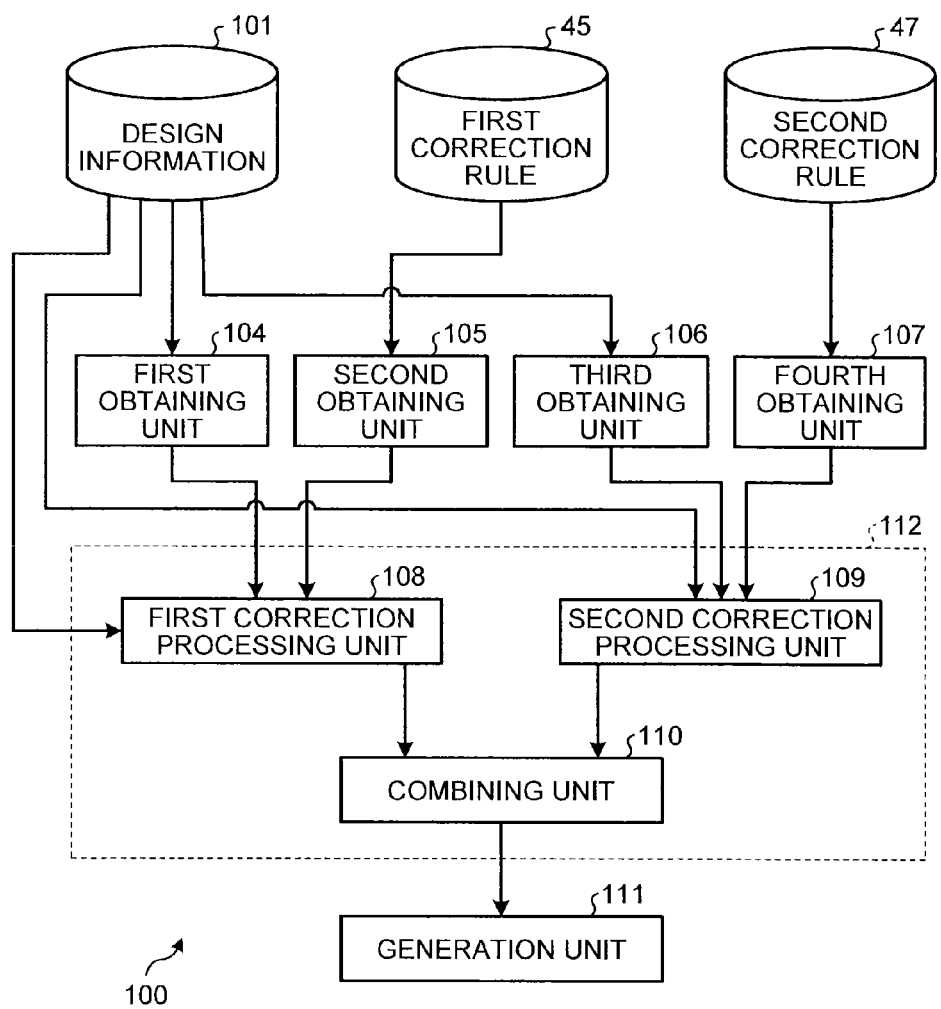
FIG. 3 is a figure illustrating a configuration of a mask data generation system according to the embodiment.

Subsequently, the configuration of a mask data generation system 100 achieved on the computer 1 with the mask data generation program will be explained with reference to FIG. 3. FIG. 3 is a figure illustrating a configuration of the mask data generation system 100.

The mask data generation system 100 includes a first obtaining unit 104, a second obtaining unit 105, a third obtaining unit 106, a fourth obtaining unit 107, a first correction processing unit 108, a second correction processing unit 109, a combining unit 110, and a generation unit 111.

The first obtaining unit 104 obtains the depth information 43. For example, the first obtaining unit 104 obtains the design information 101 via the medium interface 70 or the communication interface 80, and extracts the depth information 43 from the design information 101 and stores the depth information 43 to the storage unit 40 as well as provides the depth information 43 to the first correction processing unit 108. The depth information 43 is information about the pattern depth of each hole arranged in the design layout data 41 of the processing target (see FIG. 7F).

The second obtaining unit 105 obtains the first correction rule 45. For example, when the first correction rule 45 is present on the storage unit 40, the second obtaining unit 105 reads the first correction rule 45. When the first correction rule 45 is not present on the storage unit 40, the second obtaining unit 105 generates a first correction rule 45 as explained later and stores the generated first correction rule 45 to the storage unit 40, and also provides the generated first correction rule 45 to the first correction processing unit 108. In the first correction rule 45, the amount of correction of the process conversion difference and the layer number corresponding to the pattern depth are associated with each other for multiple layer numbers (see FIG. 8C).

The third obtaining unit 106 obtains the arrangement information 44. For example, the third obtaining unit 106 obtains the design information 101 via the medium interface 70 or the communication interface 80, and extracts the arrangement information 44 from the design information 101, and stores the arrangement information 44 to the storage unit 40 and also provides the arrangement information 44 to the second correction processing unit 109. The arrangement information 44 is information about the arrangement attribute of each hole arranged in the design layout data 41 of the processing target (for example, average inter-pattern distance) (see FIG. 10B).

The fourth obtaining unit 107 obtains the second correction rule 47. For example, when the second correction rule 47 is present on the storage unit 40, the fourth obtaining unit 107 reads the second correction rule 47. When the second correction rule 47 is not present on the storage unit 40, the fourth obtaining unit 107 generates a second correction rule 47 as explained later and provides the generated second correction rule 47 to the storage unit 40 and also provides the generated second correction rule 47 to the second correction processing unit 109. In the second correction rule 47, the amount of correction of the process conversion difference and the classification corresponding to the arrangement attribute are associated with each other for multiple classifications (see FIG. 10E).

The first correction processing unit 108 obtains the design layout data 41. For example, the storage unit 40 stores the design layout data 41 of the processing target extracted from the design information 101 in advance. The first correction processing unit 108 reads the design layout data 41 of the processing target from the storage unit 40. The design layout data 41 includes multiple hole patterns PT11 to PT63 (see FIG. 7A). The first correction processing unit 108 receives the depth information 43 from the first obtaining unit 104, and receives the first correction rule 45 from the second obtaining unit 105. The first correction processing unit 108 applies the first process conversion difference correction processing, based on the depth information 43 and the first correction rule 45, to the dimensions of the hole patterns PT11 to PT63 arranged on the design layout data 41. Therefore, the first correction processing unit 108 generates the first correction layout data (see FIG. 12B) and provides the first correction layout data to the combining unit 110.

The second correction processing unit 109 obtains the design layout data 41. For example, the second correction processing unit 109 reads the design layout data 41 of the processing target from the storage unit 40. The second correction processing unit 109 receives the arrangement information 44 from the third obtaining unit 106 and receives the second correction rule 47 from the fourth obtaining unit 107. The second correction processing unit 109 applies the second process conversion difference correction processing, based on the arrangement information 44 and the second correction rule 47, to the dimensions of the hole patterns PT11 to PT63 arranged on the design layout data 41. Therefore, the second correction processing unit 109 generates the second correction layout data (see FIG. 12A) and provides the second correction layout data to the combining unit 110.

The combining unit 110 receives the first correction layout data from the first correction processing unit 108, and receives the second correction layout data from the second correction processing unit 109. The combining unit 110 combines the first correction layout data and the second correction layout data, thus generating temporary mask data. For example, the combining unit 110 may combine the first correction layout data and the second correction layout data by two-dimensional simple addition averaging, or may combine the first correction layout data and the second correction layout data by adding weights to the first correction layout data and the second correction layout data and add and average them in a two-dimensional manner. The temporary mask data include multiple lithography target patterns. The combining unit 110 provides the generated temporary mask data (see FIG. 12C) to the generation unit 111.

It should be noted that the configuration including the first correction processing unit 108, the second correction processing unit 109, and the combining unit 110 function as a correction unit 112 for determining the temporary mask data by applying the first process conversion difference correction processing and the second process conversion difference correction processing to the design layout data 41.

The generation unit 111 generates the mask data (see FIG. 12D) by applying optical proximity correction processing to each lithography target pattern in the temporary mask data so that the resist pattern to be developed becomes the lithography target pattern.

Figure 4:
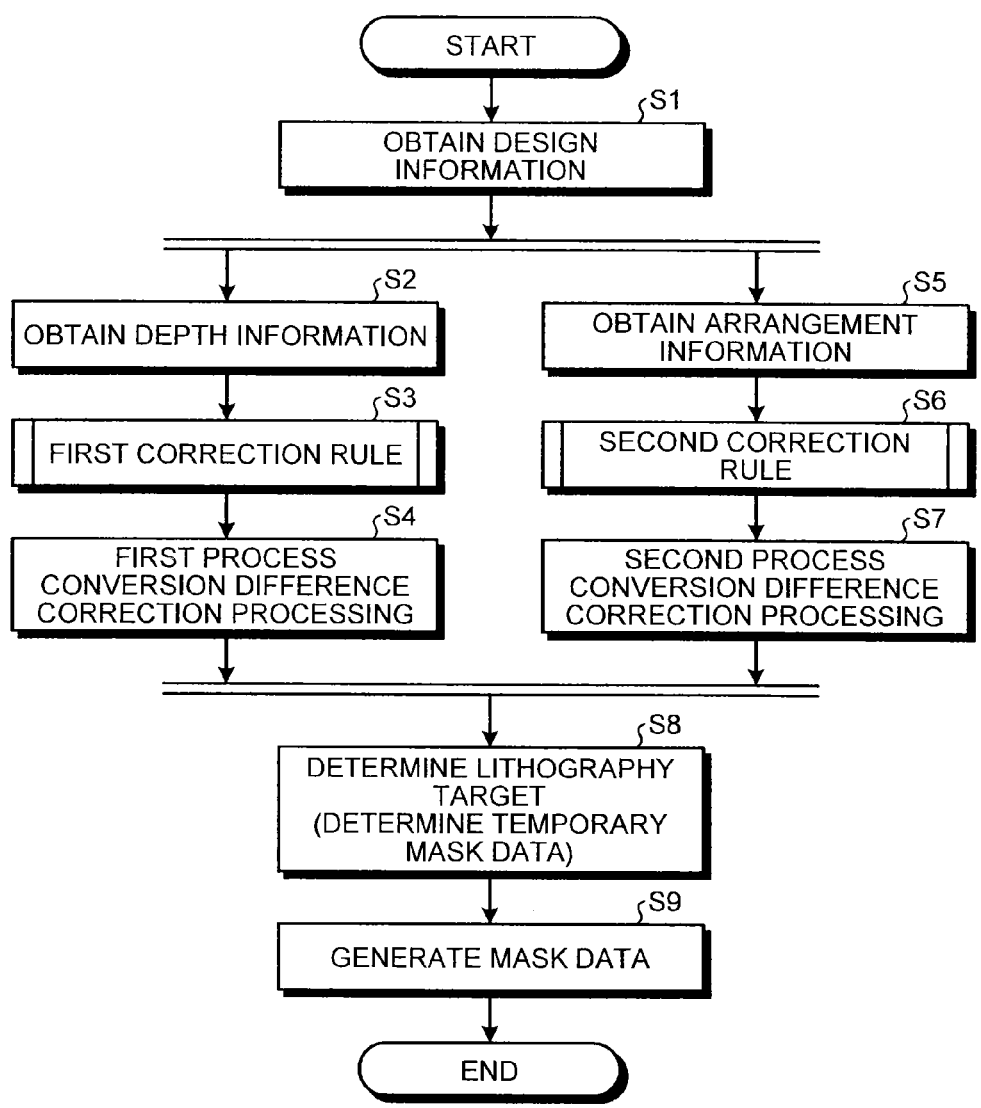
FIG. 4 is a flowchart illustrating a mask data generation method according to the embodiment.

Subsequently, the mask data generation method according to the embodiment will be explained with reference to FIG. 4. FIG. 4 is a flowchart illustrating a flow of a mask data generation method.

In step S1, the control unit 20 of the computer 1 obtains the design information 101. The control unit 20 may obtain the design information 101 by way of the recording medium RM via the medium interface 70, or may obtain the design information 101 by way of a wired communication like or a wireless communication like via the communication interface 80. The control unit 20 extracts the design layout data 41 of the processing target from the obtained design information 101, and stores the design layout data 41 of the processing target to the storage unit 40.

The recording medium RM recording the mask data generation program 48 is connected to the medium interface 70. Then, the mask data generation program 48 is installed, and stored to the storage unit 40 via the control unit 20.

A user uses the input unit 60 to input an activation command of the mask data generation program 48. The control unit 20 receives an activation command of the mask data generation program 48, and refers to the storage unit 40 based on the activation command, and activates the mask data generation program 48. In accordance with the mask data generation program 48, the control unit 20 refers to the storage unit 40, and displays the design layout data 41 on the display unit 30.

In accordance with this, the processing in steps S2 to S4 and the processing in steps S5 to S7 are performed in parallel with each other.

In step S2, the control unit 20 obtains the depth information 43. For example, the control unit 20 extracts the depth information 43 from the design information 101 obtained in step S1. The depth information 43 is information about the pattern depth of each hole arranged in the design layout data 41 of the processing target.

For example, the design information 101 includes not only the design layout data 41 of the layer of the processing target as illustrated in FIG. 7A but also the design layout data of lower layers. FIG. 7A is a figure illustrating the design layout data 41 of the layer of the processing target. The design layout data 41 of the layer of the processing target includes multiple hole patterns PT11 to PT63 associated with two-dimensional coordinate positions thereof. The design information 101 also includes information about the film thickness of each layer. Therefore, the configuration of each layer to be processed can be predicted in a three dimensional manner based on information about the film thickness of each layer and the design layout data of each layer included in the design information 101. The control unit 20 generates cross sectional configuration data of the design layout data 41 taken along line III-III as illustrated in FIG. 7A based on the information predicted in a three-dimensional manner. FIG. 7B illustrates cross sectional configuration data taken along line III-III as illustrated in FIG. 7A. When the cross sectional configuration data as illustrated in FIG. 7B are referred to, it is possible to find that the pattern data of the hole patterns PT63, PT53, PT43, PT33, PT23, PT13 are W1, W2, W3, W4, W5, W6, respectively. The cross section taken along line I-I and the cross section taken along line II-II in FIG. 7A can be constituted in the same manner as the cross section taken along III-III.

The control unit 20 extracts the information about the film thickness of each layer and the design layout data of each layer including the design layout data 41 of the layer of the processing target from the design information 101, and predicts the configuration of each layer in a three-dimensional manner based on the information about the film thickness of each layer and the design layout data of each layer, thus generating the three-dimensional configuration data. Then, based on the generated three-dimensional configuration data, the control unit 20 identifies the pattern depths of the hole patterns PT11 to PT63 arranged in the design layout data 41 of the layer of the processing target to generate the depth information 43, and stores the depth information 43 to the storage unit 40. The depth information 43 is information in which, for example, the pattern depths and the pattern identifiers of the hole patterns are associated with each other as illustrated in FIG. 7F. FIG. 7F is a figure illustrating a data structure of the depth information 43.

The control unit 20 generates a layer number table defining multiple layer numbers so that the identified multiple pattern depths can be classified. The control unit 20 divides the range of the values of the identified multiple pattern depths into multiple stages, and assign a layer number to each stage thus divided, and generates a layer number table from the result.

For example, in the case as illustrated in FIG. 7B, the pattern depths of the hole patterns are W1 to W6, and accordingly, the control unit 20 divides the ranges W1 to W6 of the pattern depths into four stages at the pattern depths a, b, c, and allocates the layer numbers A, B, C, D to the divided stages. The control unit 20 generates the number table 46 as illustrated in FIG. 7C from the result, and stores the generated number table 46 to the storage unit 40.

Based on the depth information 43 and layer number table 46, the control unit 20 can manage the hole patterns PT11 to PT63 arranged in the design layout data 41 in such a manner that the hole patterns PT11 to PT63 are associated with the layer numbers to which the pattern depths thereof belong. More specifically, the control unit 20 can manage the pattern depths of the hole patterns PT11 to PT63 by dividing pattern depths of the hole patterns PT11 to PT63 into multiple classifications.

For example, as illustrated in FIG. 7D, based on the depth information 43 and the layer number table 46, the control unit 20 can register the data of the hole patterns PT11 to PT63 of the design layout data 41 in such a manner that the data of the hole patterns PT11 to PT63 are associated with the layer numbers. FIG. 7D is a figure illustrating the design layout data 41 having the pattern management information (layer number) registered therein.

Alternatively, for example, as illustrated in FIG. 7E, based on the depth information 43 and the layer number table 46, the control unit 20 can generate a pattern management table in which the layer numbers and the pattern identifiers of the hole patterns are associated with each other for the multiple hole patterns PT11 to PT63. FIG. 7E is a figure illustrating a data structure of the pattern management information (pattern management table).

Figure 5:
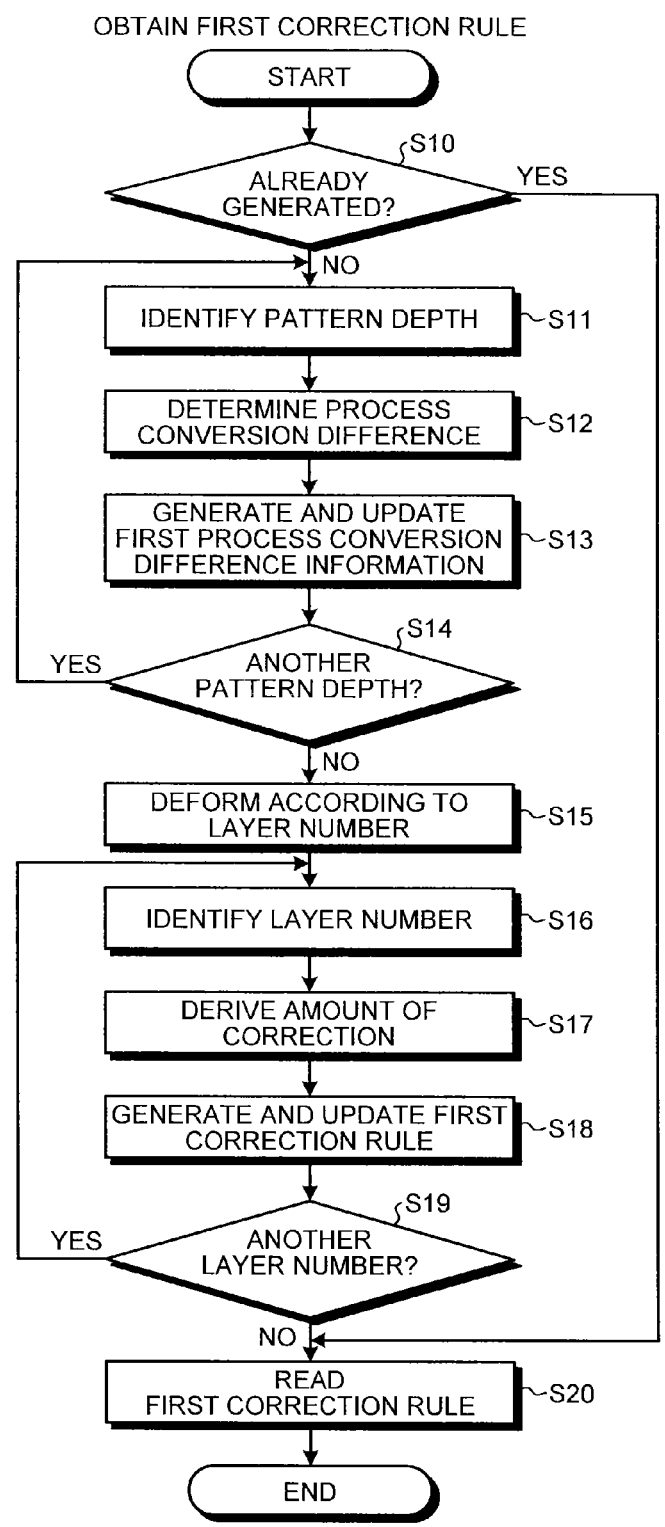
FIG. 5 is a flowchart illustrating obtaining processing for obtaining a first correction rule according to the embodiment.

In step S3, the control unit 20 obtains the first correction rule 45. More specifically, processing in steps S10 to S20 of FIG. 5 is performed. FIG. 5 is a flowchart illustrating a flow of obtaining processing for obtaining the first correction rule 45.

In step S10, the control unit 20 determines whether the first correction rule 45 is already generated or not. When the storage unit 40 stores the first correction rule 45, the control unit 20 can determine that the first correction rule 45 is already generated. When the storage unit 40 does not store the first correction rule 45, the control unit 20 can determine that the first correction rule 45 has not yet been generated. When the first correction rule 45 is already generated (Yes in step S10), the control unit 20 proceeds to processing in step S20, and when the first correction rule 45 has not yet been generated (No in step S10), the control unit 20 proceeds to processing in step S11.

In step S11, the control unit 20 identifies the pattern depth which is to be included in the first process conversion difference information. For example, the control unit 20 can identify any one of the pattern depths W1, W2, W3, W4, W5, W6 as illustrated in FIG. 7B.

In step S12 as illustrated in FIG. 5, the control unit 20 determines the process conversion difference applied to the pattern depth identified in step S11. The process conversion difference may be determined through measurement or may be determined by simulation. When the process conversion difference is determined through measurement, a resist pattern corresponding to the hole pattern of the identified pattern depth is formed on a test substrate, and the resist pattern is measured by CD-SEM. Then, etching process is performed by RIE using the resist pattern, and the processed pattern is measured by CD-SEM. For example, the control unit 20 can adopt, as the process conversion difference, a value obtained by subtracting the measured dimension of the processed pattern from the measured dimension of the resist pattern. When the process conversion difference is determined through simulation, the three-dimensional process shapes of the holes are predicted using process conditions such as RIE (for example, power supply voltage, processing gas quantity, processing chamber pressure, substrate temperature), and the resist pattern and the dimension of the processed pattern are predicted based on the predicted three-dimensional process shapes. For example, the control unit 20 may adopt, as the process conversion difference, a value obtained by subtracting the predicted dimension of the processed pattern from the predicted dimension of the resist pattern.

In step S13, the control unit 20 generates or updates the first process conversion difference information. For example, the control unit 20 plots the point corresponding to the pattern depth identified in step S11 and the process conversion difference determined in step S12 on the surface of "the process conversion difference–the pattern depth" as illustrated in FIG. 8A. On the surface of "the process conversion difference–the pattern depth" as illustrated in FIG. 8A, the vertical axis denotes the magnitude of the process conversion difference, and the horizontal axis denotes the depth of the pattern depth. When there are multiple plots on the surface of "the process conversion difference–the pattern depth", the control unit 20 derives an approximated curve F1 (W) for the multiple plots as illustrated in FIG. 8A, and incorporates this into the first process conversion difference information.

In step S14, the control unit 20 determines whether there is any not-yet-processed one among the multiple pattern depths which are to be included in the first process conversion difference information. When there is a not-yet-processed pattern depth (Yes in step S14), the control unit 20 returns back to the processing in step S11, and when there is no not-yet-processed pattern depth (No in step S14), the control unit 20 proceeds to the processing in step S15.

In step S15, the control unit 20 deforms the first process conversion difference information obtained in the repetition loop from steps S11 to S14 in accordance with the layer number derived in step S2. For example, the control unit 20 deforms the first process conversion difference information as illustrated in FIG. 8B in accordance with the layer number table 46 as illustrated in FIG. 7C. More specifically, in a range of pattern depth in which the layer number is the same, the process conversion difference is constant, and the first process conversion difference information is deformed to the first process conversion difference information F2 (W) so that the level changes in a stepwise manner so as to be along the approximated curve F1 (W) derived in step S13 every time the layer number changes.

In step S16 as illustrated in FIG. 5, the control unit 20 identifies the layer number which is to be processed from among multiple layer numbers included in the layer number table 46.

In step S17, the control unit 20 derives the amount of correction for the layer number identified in step S16. For example, when the target process conversion difference is DFst as illustrated in FIG. 8B, the control unit 20 derives the amount of correction by subtracting the process conversion difference of the layer number from the target process conversion difference DFst. In the case as illustrated in FIG. 7B, the amount of correction $dL_4$ indicated by the following expression 1 can be derived with regard to the hole patterns PT13, PT23 which are of the layer number A.

$$dL_4 = DFst - F(W6) = DFst - F(W5) \quad \text{Expression 1}$$

The amount of correction $dL_3$ as indicated by the following expression 2 can be derived with regard to the hole patterns PT33, PT43 which are of the layer number B.

$$dL_3 = DFst - F(W4) = DFst - F(W3) \quad \text{Expression 2}$$

The amount of correction $dL_2$ as indicated by the following expression 3 can be derived with regard to the hole pattern PT53 which is of the layer number C.

$$dL_2 = DFst - F(W2) \quad \text{Expression 3}$$

The amount of correction $dL_1$ as indicated by the following expression 4 can be derived with regard to the hole pattern PT63 which is of the layer number D.

$$dL_1 = DFst - F(W1) \quad \text{Expression 4}$$

In step S18, the control unit 20 generates or updates the first correction rule 45 in accordance with the amount of correction derived in step S17. For example, the control unit 20 generates or updates the table as illustrated in FIG. 8C in such a manner that the layer number identified in step S16 is associated with the amount of correction derived in step S17. The control unit 20 stores the generated or updated first correction rule 45 to the storage unit 40.

As illustrated in FIG. 8C, the first correction rule 45 is such that when the layer number becomes a layer number that corresponds to a deeper pattern depth, e.g., D→C→B→A, as indicated by the following expression 5, the amount of correction increases as indicated by the following expression 6.

$$W1 < W2 < W3 < W4 < W5 < W6 \quad \text{Expression 5}$$

$$dL_1 < dL_2 < dL_3 < dL_4 \quad \text{Expression 6}$$

In FIGS. 8B, 8C, for example, the amounts of corrections $dL_4$, $dL_3$ are positive, and the amounts of corrections $dL_2$, $dL_1$ are negative. However, the positive/negative signs may change in accordance with how the target process conversion difference DFst is defined.

In step S19, the control unit 20 determines whether there is any not-yet-processed layer number among multiple layer numbers which is to be included in the first correction rule 45. When there is a not-yet-processed layer number (Yes in step S19), the control unit 20 returns back to the processing in step S16, and when there is not any not-yet-processed layer number (No in step S19), the control unit 20 proceeds to the processing in step S20.

In step S20 as illustrated in FIG. 5, the control unit 20 reads the first correction rule 45 from the storage unit 40, and obtains the first correction rule 45.

In step S4 as illustrated in FIG. 4, the control unit 20 applies the first process conversion difference correction processing to the dimension of each hole pattern arranged in the design layout data 41 based on the depth information 43 obtained in step S2 and the first correction rule 45 obtained in step S3 (step S20). For example, in accordance with the depth information 43 and the layer number table 46, the control unit 20 derives the pattern management information as illustrated in FIG. 7D or 7E, and identifies the layer number of each hole pattern arranged in the design layout data 41. Then, in accordance with the first correction rule 45 as illustrated in FIG. 8C, the control unit 20 corrects the dimension of each hole pattern arranged in the design layout data 41 using the amount of correction corresponding to the layer number associated therewith.

Figures 9A, 9B:
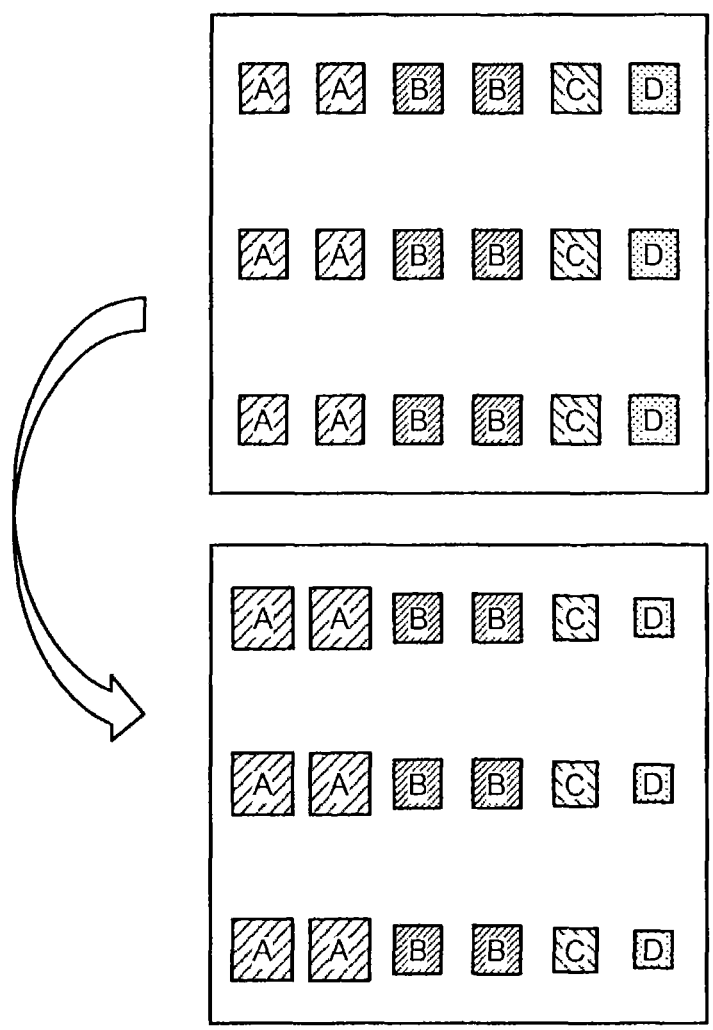
FIGS. 9A-9B are figures illustrating first process conversion difference correction processing according to the embodiment.

Therefore, the control unit 20 can generate the first correction layout data as illustrated in FIG. 9B from the design layout data 41 as illustrated in FIG. 9A. For example, when the amount of correction $dL_4$, $dL_3$ are positive quantities and the amount of correction $dL_2$, $dL_1$ are negative quantities as illustrated in FIGS. 8B, 8C, the hole patterns in the layer numbers A, B are corrected so that the dimensions thereof become larger, and the hole patterns in the layer numbers C, D are corrected so that the dimensions thereof become smaller. Therefore, the component dependent on the pattern depth in the process conversion difference of each hole pattern can be configured to be closer to the target process conversion difference DFst, and where the target process conversion difference DFst is approximately zero, the component dependent on the pattern depth in the process conversion difference of each hole pattern can be easily reduced.

On the other hand, in step S5 as illustrated in FIG. 4, the control unit 20 obtains the arrangement information 44. For example, the control unit 20 extracts the arrangement information 44 from the design information 101 obtained in step S1. The arrangement information 44 is information about the arrangement attribute of each hole pattern (for example, average inter-pattern distance) arranged in the design layout data 41 of the processing target.

For example, the design information 101 includes the design layout data 41 of the layer of the processing target as illustrated in FIG. 10A. FIG. 10A is a figure illustrating the design layout data 41 of the layer of the processing target. The design layout data 41 of the layer of the processing target includes multiple hole patterns PT11 to PT63 associated with the two-dimensional coordinate positions thereof. By referring to the design layout data 41 as illustrated in FIG. 10A, the average inter-pattern distance of the hole patterns PT11 to PT63 can be found out. The average inter-pattern distance is such that, when attention is given to any one of the hole patters in the design layout data 41, the average inter-pattern distance is obtained by deriving the distances from the center of the hole pattern in question to the distances of the hole patterns included in a circle of a reference distance and averaging the distances. For example, when attention is given to the hole pattern PT42, a circle of a reference distance from the center of the hole pattern PT42 is a circle indicated by a broken line in FIG. 10A. In this case, an average inter-pattern distance Spt42 of the hole pattern PT42 is $(S_1+S_2)/2$ which is obtained by averaging distances $S_1$, $S_2$ from the center of the hole pattern PT42 to the hole patterns PT32, PT52 included in the circle of the reference distance. At this occasion, the hole pattern PT43 is not included in the circle of the reference distance, and therefore, the distance $S_3$ to the hole pattern PT43 is not used.

The control unit 20 extracts the design layout data 41 of the layer of the processing target from the design information 101, and adopts each of the hole patterns PT11 to PT63 arranged in the design layout data 41 as the hole pattern in question in order to derive the average inter-pattern distance, and generates the arrangement information 44 and stores the arrangement information 44 to the storage unit 40. For example, as illustrated in FIG. 10B, the arrangement information 44 is information in which the pattern identifier of the hole pattern and the average inter-pattern distance are associated with each other. FIG. 10B is a figure illustrating a data structure of the arrangement information 44.

The control unit 20 defines the multiple classifications so as to be able to classify the identified multiple average inter-pattern distances into classifications. The control unit 20 defines the ranges of the values of the identified multiple average inter-pattern distances by dividing them into multiple stages.

For example, in the case as illustrated in FIG. 10B, the average inter-pattern distances of the hole pattern are $S_0$ to $S_4$ (see FIG. 10E), and accordingly, the control unit 20 defines the ranges $S_0$ to $S_4$ of the average inter-pattern distances by dividing them at the average inter-pattern distances $S_3$, $S_2$, $S_1$ into four stages. The control unit 20 generates the definition information thereof, and stores the definition information to the storage unit 40.

Figure 6:
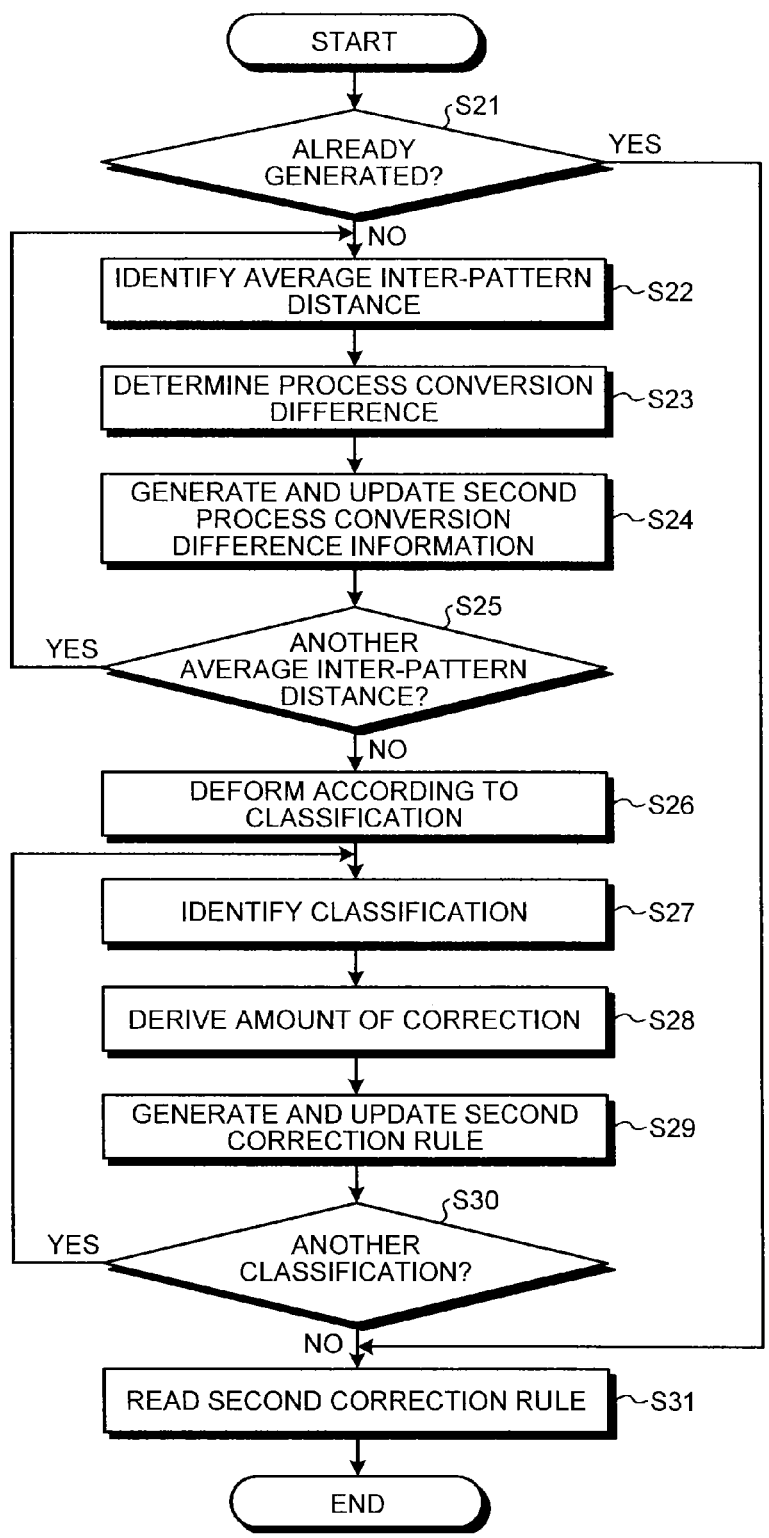
FIG. 6 is a flowchart illustrating obtaining processing for obtaining a second correction rule according to the embodiment.

In step S6, the control unit 20 obtains the second correction rule 47. More specifically, the processing in steps S21 to S31 of FIG. 6 is performed. FIG. 6 is a flowchart illustrating a flow of obtaining processing of the second correction rule 47.

In step S21, the control unit 20 determines whether the second correction rule 47 is already generated or not. When the storage unit 40 stores the second correction rule 47, the control unit 20 can determine that the second correction rule 47 is already generated, and when the storage unit 40 does not store the second correction rule 47, the control unit 20 can determine that the second correction rule 47 has not yet been generated. When the second correction rule 47 is already generated (Yes in step S21), the control unit 20 proceeds to the processing in step S31, and when the second correction rule 47 has not yet been generated (No in step S21), the control unit 20 proceeds to the processing in step S22.

In step S22, the control unit 20 identifies the average inter-pattern distance which is to be included in the second process conversion difference information. For example, the control unit 20 can identify any one of the average inter-pattern distances Spt11, ..., Spt42, ..., Spt63 as illustrated in FIG. 10B.

In step S23 as illustrated in FIG. 6, the control unit 20 determines the process conversion difference for the average inter-pattern distance identified in step S22. The process conversion difference may be determined through measurement or may be determined by simulation. When the process conversion difference is determined through measurement, a resist pattern corresponding to the hole pattern of the identified average inter-pattern distance is formed on a test substrate, and the resist pattern is measured by CD-SEM. Then, etching process is performed by RIE using the resist pattern, and the processed pattern is measured by CD-SEM. For example, the control unit 20 can adopt, as the process conversion difference, a value obtained by subtracting the measured dimension of the processed pattern from the measured dimension of the resist pattern. When the process conversion difference is determined through simulation, the three-dimensional process shapes of the holes are predicted using process conditions such as RIE (for example, power supply voltage, processing gas quantity, processing chamber pressure, substrate temperature), and the resist pattern and the dimension of the processed pattern are predicted based on the predicted three-dimensional process shapes. For example, the control unit 20 may adopt, as the process conversion difference, a value obtained by subtracting the predicted dimension of the processed pattern from the predicted dimension of the resist pattern.

In step S24, the control unit 20 generates or updates the second process conversion difference information. For example, the control unit 20 plots the point corresponding to the average inter-pattern distance identified in step S22 and the process conversion difference determined in step S23 on the surface of "the process conversion difference–the average inter-pattern distance" as illustrated in FIG. 10C. On the surface of "the process conversion difference–the average inter-pattern distance" as illustrated in FIG. 10C, the vertical axis denotes the magnitude of the process conversion difference, and the horizontal axis denotes the length of the average inter-pattern distance. When there are multiple plots on the surface of "the process conversion difference–the average inter-pattern distance", the control unit 20 derives an approximated curve F3 (S) for the multiple plots as illustrated in FIG. 10C, and incorporates this into the second process conversion difference information.

In step S25, the control unit 20 determines whether there is any not-yet-processed one among the multiple average inter-pattern distances which are to be included in the second process conversion difference information. When there is a not-yet-processed average inter-pattern distance (Yes in step S25), the control unit 20 returns back to the processing in step S22, and when there is no not-yet-processed average inter-pattern distance (No in step S25), the control unit 20 proceeds to the processing in step S26.

In step S26, the control unit 20 deforms the second process conversion difference information obtained in the repetition loop from steps S22 to S25 in accordance with the classification derived in step S5. For example, the control unit 20 deforms the second process conversion difference information as illustrated in FIG. 10D in accordance with the definition information about multiple classifications. More specifically, in a range of average inter-pattern distance in which the classification is the same, the process conversion difference is constant, and the second process conversion difference information is deformed to the second process conversion difference information F4 (S) so that the level changes in a stepwise manner so as to be along the approximated curve F3 (S) derived in step S24 every time the classification changes.

In step S27 as illustrated in FIG. 6, the control unit 20 identifies the classification which is to be processed from among multiple classifications included in the definition information.

In step S28, the control unit 20 derives the amount of correction for the classification identified in step S27. For example, when the target process conversion difference is DFst as illustrated in FIG. 10D, the control unit 20 derives the amount of correction by subtracting the process conversion difference of the classification from the target process conversion difference DFst. In the case as illustrated in FIG. 10D, the amount of correction $dL_{12}$ indicated by the following expression 7 can be derived with regard to the hole pattern PT42 where the average inter-pattern distance satisfies $S1 \leq (S1+S2)/2 < S2$.

$$dL_{12} = DFst - F((S_1+S_2)/2) \quad \text{Expression 7}$$

In step S29, the control unit 20 generates or updates the second correction rule 47 in accordance with the amount of correction derived in step S28. For example, the control unit 20 generates or updates the table as illustrated in FIG. 10E in such a manner that the classification identified in step S27 and the amount of correction derived in step S28 are associated with each other. The control unit 20 stores the generated or updated second correction rule 47 to the storage unit 40.

In the second correction rule 47 as illustrated in FIG. 10E, as the classification changes to one that supports a longer average inter-pattern distance as indicated by the following expression 8, the amount of correction thereof changes to a greater quantity as indicated by the following expression 9.

$$S_0 < S_1 < S_2 < S_3 \quad \text{Expression 8}$$

$$dL_{11} < dL_{12} < dL_{13} < dL_{14} \quad \text{Expression 9}$$

It should be noted that FIGS. 10D, 10E illustrate the case where, for example, the amounts of corrections $dL_{14}$, $dL_{13}$ are positive quantities and the amounts of corrections $dL_{12}$, $dL_{11}$ are negative quantities. However, the positive/negative signs may change in accordance with how the target process conversion difference DFst is defined.

In step S30, the control unit 20 determines whether there is any not-yet-processed classification among multiple classifications which is to be included in the second correction rule 47. When there is a not-yet-processed classification (Yes in step S30), the control unit 20 returns back to the processing in step S27, and when there is not any not-yet-processed classification (No in step S30), the control unit 20 proceeds to the processing in step S31.

In step S31 as illustrated in FIG. 6, the control unit 20 reads the second correction rule 47 from the storage unit 40 and obtains the second correction rule 47.

In step S7 as illustrated in FIG. 4, the control unit 20 applies the second process conversion difference correction processing to the dimension of each hole pattern arranged in the design layout data 41 based on the arrangement information 44 obtained in step S5 and the second correction rule 47 obtained in step S6 (step S31). For example, the control unit 20 identifies the classification to which the average inter-pattern distance of each hole pattern arranged in the design layout data 41 belongs, in accordance with the arrangement information 44 and the definition information of multiple classifications. Then, the control unit 20 corrects the dimension of each hole pattern arranged in the design layout data 41 using the amount of correction corresponding to the classification in accordance with the second correction rule 47 as illustrated in FIG. 10E.

Figures 11A, 11B:
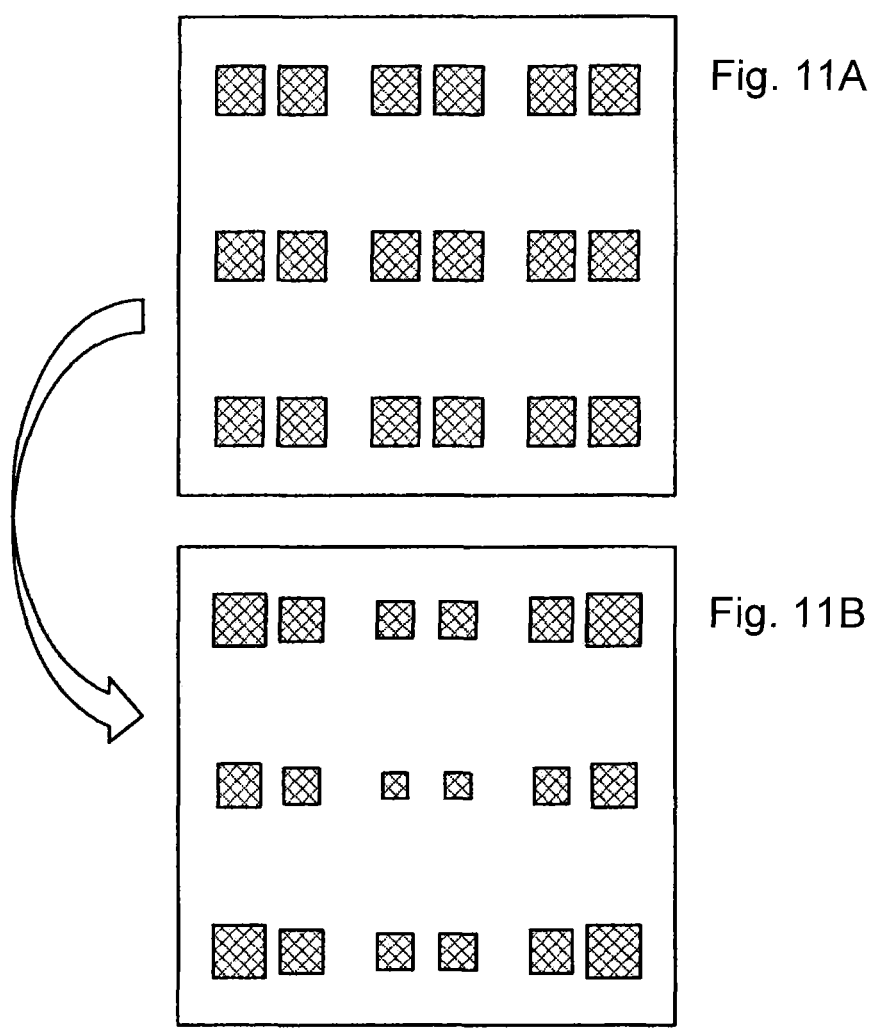
FIGS. 11A-11B are figures illustrating second process conversion difference correction processing according to the embodiment.

Therefore, the control unit 20 can generate the second correction layout data as illustrated in FIG. 11B from the design layout data 41 as illustrated in FIG. 11A. For example, when the amounts of corrections $dL_{14}$, $dL_{13}$ are positive quantities and the amounts of corrections $dL_{12}$, $dL_{11}$ negative quantities as illustrated in FIGS. 10D, 10E, the hole patterns in the classifications "$S_3 \leq S$", "$S_2 \leq S < S_3$" are corrected so that the dimensions thereof becomes larger, and hole patterns in the classifications "$S_1 \leq S < S_2$", "$S_0 \leq S < S_1$" are corrected so that the dimensions thereof becomes smaller. Therefore, the component dependent on the arrangement attribute in the process conversion difference of each hole pattern can be configured to be closer to the target process conversion difference DFst, and where the target process conversion difference DFst is approximately zero, the component dependent on the arrangement attribute in the process conversion difference of each hole pattern can be easily reduced.

In step S8, the control unit 20 waits until both of the processing in step S4 and the processing in step S7 are finished. When both of the processing in step S4 and the processing in step S7 are finished, the control unit 20 determines the temporary mask data including multiple lithography target patterns. More specifically, the control unit 20 combines the first correction layout data generated in step S4 and the second correction layout data generated in step S7, thus generating the temporary mask data.

For example, the combining unit 110 may combine the first correction layout data and the second correction layout data by two-dimensional simple addition averaging. More specifically, when the first correction layout data and the second correction layout data are arranged in an overlapping manner, the combining unit 110 may make a contour line of each hole pattern which is made by determining middle points of points corresponding to the contour lines of the hole patterns and making composition using a set of determined middle points. Alternatively, for example, the combining unit 110 may combine the first correction layout data and the second correction layout data by adding weights to the first correction layout data and the second correction layout data and add and average them in a two-dimensional manner. More specifically, when the first correction layout data and the second correction layout data are arranged in an overlapping manner, the combining unit 110 may make a contour line of each hole pattern which is made by determining a point arranged with each weight between the points corresponding to the contour lines of the hole patterns and making composition using a set of determined middle points.

The control unit 20 combines the first correction layout data as illustrated in FIG. 12B and the second correction layout data as illustrated in FIG. 12A, thus being able to determine the temporary mask data as illustrated in FIG. 12C. The temporary mask data include multiple lithography target patterns. Therefore, both of the component dependent on the arrangement attribute and the component dependent on the pattern depth in the process conversion difference of each lithography target pattern can be configured to be closer to the target process conversion difference DFst, and where the target process conversion difference DFst is approximately zero, both of the component dependent on the arrangement attribute and the component dependent on the pattern depth in the process conversion difference of each lithography target pattern can be easily reduced.

In step S9, the control unit 20 generates mask data. More specifically, the control unit 20 applies the optical proximity correction processing to each lithography target pattern in the temporary mask data so that the resist pattern to be developed becomes the lithography target pattern, and generates the data 42 about the mask as illustrated in FIG. 12D. Then, a drawing device (not illustrated) obtains the data 42 about the mask, and draws a pattern of Cr or absorbing material on the mask MK (see FIG. 13) according to the data 42 about the mask.

Figure 13:
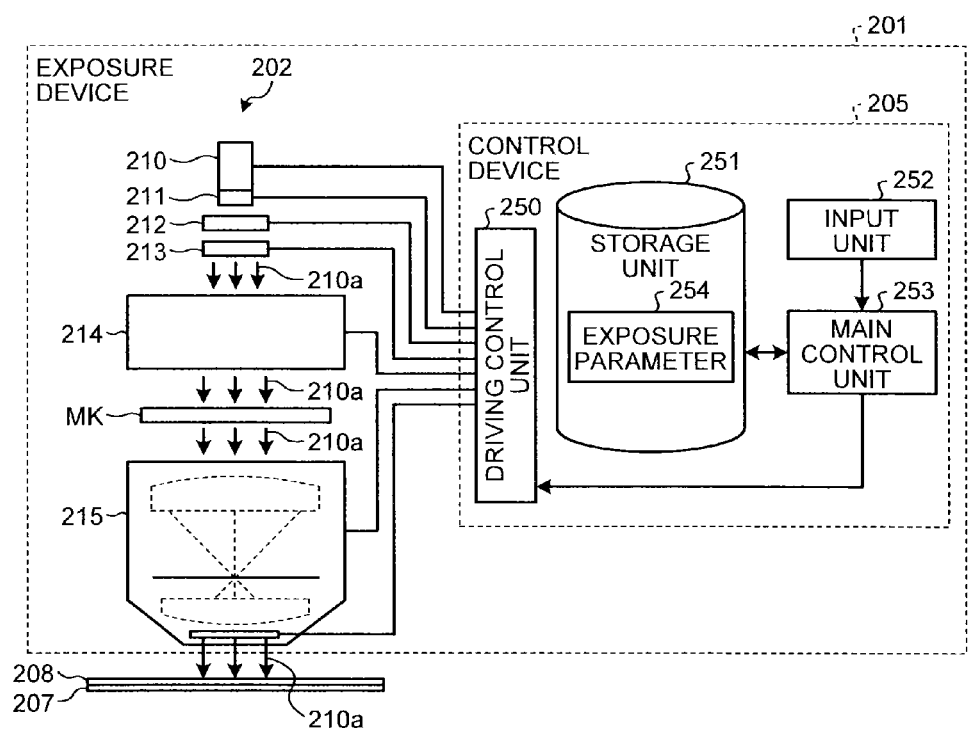
FIG. 13 is a figure illustrating a configuration of an exposure device performing exposure processing using the mask generated by the mask data generation method according to the embodiment.

Subsequently, the configuration of the exposure device 201 performing the exposure processing using the mask MK thus generated will be explained with reference to FIG. 13.

The exposure device 201 includes an exposure device main body 202 and a control device 205. The control device 205 includes an input unit 252, a main control unit 253, a storage unit 251, and a driving control unit 250. The main control unit 253 receives input of exposure parameters (for example, exposure quantity, focus value, and the like) via the input unit 252, and stores the exposure parameters to the storage unit 251 as the exposure parameter information 254. The main control unit 253 controls each unit of the exposure device main body 202 via the driving control unit 250 based on the exposure parameter information 254.

The exposure device main body 202 includes a light source 210, an aperture diaphragm 211, a filter 212, a polarization filter 213, an illumination optical system 214, and a projection optical system 215.

The aperture diaphragm 211 is, for example, in a substantially disk-shaped, and includes a light emission area (illumination area) and a non-light emission area (illumination shielding area). The non-light emission area is an area where exposure light 210a emitted from the light source 210 is shielded, and the light emission area is an area where exposure light 210a emitted from the light source 210 is passed through. More specifically, the aperture diaphragm 211 adjusts the illumination shape. Accordingly, on the mask MK, the illumination light is emitted by the illumination optical system 214, and by way of the projection optical system 215, a latent image is formed on the photosensitive material (for example, resist) 208 on the substrate 207. FIG. 13 illustrates, for example, a case where the mask MK is a transparent mask, but the mask MK may also be a reflection type mask.

As described above, in the embodiment, the first process conversion difference correction processing is applied to the dimension of each hole pattern arranged in the design layout data 41 based on the depth information 43 and the first correction rule 45, and the temporary mask data including the lithography target pattern are determined. Therefore, the precision of the process conversion difference correction processing for the pattern depth can be improved, and the component dependent on the pattern depth in the process conversion difference of the lithography target pattern of each hole can be easily reduced. As a result, when the design layout data 41 include multiple hole patterns of which pattern depths are different in a mixed manner, the precision of the process conversion difference correction processing of each of the multiple hole patterns can be improved.

In the embodiment, the process conversion differences for multiple pattern depths different from each other are determined, and based on the result of the determination, the amount of correction for the process conversion difference of the pattern depth is derived for multiple pattern depths. Then, the first correction rule is generated in accordance with the amount of correction for the multiple pattern depths derived. Therefore, the first correction rule used to correct the process conversion difference between the resist pattern and the processed pattern in terms of the pattern depth can be generated.

In the embodiment, the layer number table including multiple layer numbers divided into classifications in terms of the pattern depth is defined. The hole pattern is managed in association with the layer number according to the pattern depth. Therefore, in the first process conversion difference correction processing, correction can be done using the amount of correction according to the layer number associated with the dimension of each hole pattern.

In the embodiment, the first process conversion difference correction processing is applied to the dimension of each hole pattern arranged in the design layout data 41 based on the depth information 43 and the first correction rule 45, and the first correction layout data are generated. The second process conversion difference correction processing is applied to the dimension of each hole pattern arranged in the design layout data 41 based on the arrangement information 44 and the second correction rule 47, and the second correction layout data is generated. Then, the first correction layout data and the second correction layout data are combined, and the temporary mask data including the multiple lithography target patterns are determined. Therefore, both of the component dependent on the arrangement attribute and the component dependent on the pattern depth in the process conversion difference of each lithography target pattern can be easily reduced.

In the embodiment, for example, the arrangement attributes which are to be included in the second correction rule are the average inter-pattern distances. Alternatively, the arrangement attributes which are to be included in the second correction rule may be pattern densities. In this case, in step S5 as illustrated in FIG. 4, the pattern densities of the hole patterns PT11 to PT63 can be found out by referring to the design layout data 41 as illustrated in FIG. 14A. The pattern density is such that, when attention is given to any one of the hole patterns of the design layout data 41, the pattern density is obtained by deriving the summation of the sizes of areas of the hole patterns included in the circle of the reference distance from the center of the hole pattern in question and dividing the summation by the size of area of the circle of the reference distance. For example, when attention is given to the hole pattern PT42, the circle of the reference distance from the center of the hole pattern PT42 is the circle indicated by the broken line in FIG. 14A. In this case, the pattern density Dpt42 of the hole pattern PT42 is obtained by deriving the summation of the sizes of areas $A_1$, $A_2$ of the hole patterns PT32, PT52 included in the circle of the reference distance and dividing the summation by the size of area Ac of the circle. More specifically, the pattern density Dpt42 of the hole pattern PT42 is $(A_1+A_2)/Ac$.

The control unit 20 extracts the design layout data 41 of the layer of the processing target from the design information 101, and adopts each of the hole patterns PT11 to PT63 arranged in the design layout data 41 as the hole pattern in question and derives the pattern density, and generates the arrangement information 44 and stores the arrangement information 44 to the storage unit 40. For example, as illustrated in FIG. 14B, the arrangement information 44 is information in which the pattern identifier of the hole pattern and the pattern density are associated with each other. FIG. 14B is a figure illustrating a data structure of the arrangement information 44.

The control unit 20 defines the multiple classifications so as to be able to classify the identified multiple pattern densities into classifications. The control unit 20 defines the ranges of the values of the identified multiple pattern densities by dividing them into multiple stages.

For example, in the case as illustrated in FIG. 14B, the pattern densities of the hole pattern are $D_0$ to $D_4$ (see FIG. 14E), and accordingly, the control unit 20 defines the ranges $D_0$ to $D_4$ of the pattern densities by dividing them at the pattern densities $D_3$, $D_2$, $D_1$ into four stages. The control unit 20 generates the definition information thereof, and stores the definition information to the storage unit 40.

In step S24 as illustrated in FIG. 6, the control unit 20 plots the point corresponding to the pattern density identified in step S22 and the process conversion difference determined in step S23 on the surface of "the process conversion difference–the pattern density" as illustrated in FIG. 14C. On the surface of "the process conversion difference–the pattern density" as illustrated in FIG. 14C, the vertical axis denotes the magnitude of the process conversion difference, and the horizontal axis denotes the magnitude of the pattern density. In the horizontal axis, in FIG. 14C, the pattern density increases at a position closer to the left side, and the pattern density decreases at a position closer to the right side. When there are multiple plots on the surface of "the process conversion difference–the pattern density", the control unit 20 derives an approximated curve F6 (D) for the multiple plots as illustrated in FIG. 14C, and incorporates this into the second process conversion difference information.

In step S26 as illustrated in FIG. 6, the control unit 20 deforms the second process conversion difference information as illustrated in FIG. 14D in accordance with the definition information about multiple classifications. More specifically, in a range of pattern density in which the classification is the same, and the second process conversion difference information is deformed to the second process conversion difference information F7 (D) so that the level changes in a stepwise manner so as to be along the approximated curve F6 (D) derived in step S24 every time the classification changes.

In step S28 as illustrated in FIG. 6, the control unit 20 derives the amount of correction for the classification identified in step S27. For example, when the target process conversion difference is DFst as illustrated in FIG. 14D, the control unit 20 derives the amount of correction by subtracting the process conversion difference of the classification from the target process conversion difference DFst.

In step S29 as illustrated in FIG. 6, the control unit 20 generates or updates the second correction rule 47 in accordance with the amount of correction derived in step S28. For example, the control unit 20 generates or updates the table as illustrated in FIG. 14E in such a manner that the classification identified in step S27 and the amount of correction derived in step S28 are associated with each other. The control unit 20 stores the generated or updated second correction rule 47 to the storage unit 40.

In the second correction rule 47 as illustrated in FIG. 14E, as the classification changes to one that supports a lower pattern density as indicated by the following expression 10, the amount of correction thereof changes to a greater quantity as indicated by the following expression 11.

$$D_0 > D_1 > D_2 > D_3 \qquad \text{Expression 10}$$

$$dL_{11} < dL_{12} < dL_{13} < dL_{14} \qquad \text{Expression 11}$$

Or, in the embodiment, for example, the cross sectional configurations are the same, which are expected when taken along line I-I, line II-II, line III-III, which are in parallel with each other, in multiple hole patterns arranged in the design layout data 41. These cross sectional configurations may be different from each other.

For example, as illustrated in FIG. 15A, the cross sectional configurations are different from each other as illustrated in FIG. 15B, which are expected when taken along line I'-I', line II'-II', line III'-III', which are in parallel with each other, multiple hole patterns arranged in the design layout data 41'. At this occasion, the design layout data 41' as illustrated in FIG. 15A and the layer number table 46 as illustrated in FIG. 15C may be configured to be referred to from each other. In this case, the control unit 20 refers to the layer number table 46 from the design layout data 41', and can manage the hole patterns PT11 to PT63 arranged in the design layout data 41' in such a manner that the hole patterns PT11 to PT63 are associated with the layer numbers to which the patter depths thereof belong.

More specifically, the control unit 20 generates cross sectional configuration data of patterns taken along line I'-I', line II'-II', line III'-III' of the design layout data 41'. In accordance with multiple pattern depths obtained from the cross sectional configuration data, the control unit 20 generates the depth information 43, and determines multiple layer numbers. The control unit 20 generates the layer number table 46 in which the layer number and the pattern depth are associated with each other for the multiple layer numbers. Based on the depth information 43 and the layer number table 46, the control unit 20 registers the layer number in such a manner that it is associated with data of each hole pattern in the design layout data 41'. The control unit 20 links the design layout data 41' with the layer number table 46, thus generating the design data having the pattern depth information. Therefore, the design layout data 41' having the pattern management information (layer number) registered therein can be easily generated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
    obtaining depth information about a pattern depth of a hole included in design information about the semiconductor device;
    obtaining a first correction rule used to correct, in terms of the pattern depth, a process conversion difference between a resist pattern and a processed pattern;
    creating temporary mask data including a lithography target pattern by applying a first process conversion difference correction processing to a dimension of hole pattern arranged in design layout data based on the depth information and the first correction rule;
    generating mask data based on the temporary mask data;
    generating a mask using the generated mask data; and
    illuminating an illumination light on the generated mask to form a latent image on photosensitive material on a substrate via a projection optical system.

2. A method of manufacturing a semiconductor device, the method comprising:
    obtaining depth information about a pattern depth of a hole included in design information about the semiconductor device;
    obtaining a first correction rule used to correct, in terms of the pattern depth, a process conversion difference between a resist pattern and a processed pattern;
    creating temporary mask data including a lithography target pattern by applying a first process conversion difference correction processing to a dimension of hole pattern arranged in design layout data based on the depth information and the first correction rule;
    generating mask data by applying an optical proximity correction processing to the lithography target pattern in the temporary mask data so that a resist pattern to be developed can reach the lithography target pattern;
    generating a mask using the generated mask data; and
    illuminating an illumination light on the generated mask to form a latent image on photosensitive material on a substrate via a projection optical system.

3. A method of manufacturing a semiconductor device, the method comprising:
    obtaining depth information about a pattern depth of a hole included in design information about the semiconductor device;
    obtaining a first correction rule used to correct, in terms of the pattern depth, a process conversion difference between a resist pattern and a processed pattern;
    creating temporary mask data including a lithography target pattern by applying a first process conversion difference correction processing to a dimension of hole pattern arranged in design layout data based on the depth information and the first correction rule;
    generating mask data based on the temporary mask data;
    generating a mask using the generated mask data; and
    illuminating an illumination light on the generated mask to form a latent image on photosensitive material on a substrate via a projection optical system,
    wherein the first process conversion difference correction processing includes correcting the dimension of the hole pattern by a first correction amount when the pattern depth of the hole pattern is a first depth, and correcting the dimension of the hole pattern by a second correction amount larger than the first correction amount when the pattern depth of the hole pattern is a second depth deeper than the first depth.

* * * * *

UNITED STATES PATENT AND TRADEMARK OFFICE
CERTIFICATE OF CORRECTION

PATENT NO. : 9,972,491 B2
APPLICATION NO. : 14/476945
DATED : May 15, 2018
INVENTOR(S) : Tsuyoshi Morisaki et al.

Page 1 of 1

It is certified that error appears in the above-identified patent and that said Letters Patent is hereby corrected as shown below:

On the Title Page

Item (72), the Inventor's information is incorrect. Item (72) should read:
-- (72) Inventors: Tsuyoshi Morisaki, Yokkaichi (JP);
                 Satoshi Usui, Nagoya (JP); Katsuhiro Ishida, Yokkaichi (JP) --

Signed and Sealed this
Eleventh Day of June, 2019

Andrei Iancu
*Director of the United States Patent and Trademark Office*